United States Patent [19]

Smith

[11] 4,131,756
[45] Dec. 26, 1978

[54] SENSOR-ASSEMBLIES FOR ENGINES
[75] Inventor: Edric R. Smith, Bookham, England
[73] Assignee: Smiths Industries Limited, London, England
[21] Appl. No.: 837,792
[22] Filed: Sep. 29, 1977
[30] Foreign Application Priority Data
Sep. 30, 1976 [GB] United Kingdom ............... 40698/76
[51] Int. Cl.² ........................................... H01L 35/02
[52] U.S. Cl. ...................................... 136/230; 73/341; 73/359 A; 340/595
[58] Field of Search ............. 73/341, 359 A; 136/230; 340/228 R

[56] References Cited
U.S. PATENT DOCUMENTS

| | | | |
|---|---|---|---|
| 3,509,768 | 5/1970 | Reynolds et al. | 73/341 |
| 3,671,328 | 6/1972 | Dixon et al. | 136/230 |
| 3,719,071 | 3/1973 | Hohenberg | 73/341 |
| 3,808,889 | 5/1974 | Rawson et al. | 73/359 A |
| 3,812,716 | 5/1974 | McIntyre | 73/341 |
| 4,058,975 | 11/1977 | Gilbert et al. | 73/341 X |

Primary Examiner—Leland A. Sebastian
Attorney, Agent, or Firm—Pollock, Vande Sande & Priddy

[57] ABSTRACT

A thermocouple-probe assembly for use in the measurement of temperature in a gas-turbine engine. The assembly has a central hub which is for mounting on the central exhaust-cone of the engine and twelve elongate thermocouple probes which extend radially from the hub such that their operative tips are located in the gas flow through the engine. Each probe has two Chromel-Alumel junctions at its operative tip, the junctions of each probe being electrically interconnected by means of four concentric electrically-conductive rings which are mounted coaxially within the hub. Two of the rings are of Chromel and two of Alumel, the wires forming the thermocouple junctions being connected to rings of the same material by means of small edge portions of the rings which are turned back and crimped around each wire. External electrical connection to the probes is made by cables connected to the rings within the hub. The hub can be filled with an electrically-insulative material further to support the connections made to the rings.

9 Claims, 4 Drawing Figures

SENSOR-ASSEMBLIES FOR ENGINES

BACKGROUND OF THE INVENTION

This invention relates to sensor-assemblies for engines.

The invention relates especially, though not exclusively to thermocouple sensor-assemblies having a plurality of thermocouple-probes extending radially from a central hub. Thermocouple sensor-assemblies of this type are used in gas-turbine engines for measuring the temperature of gas emerging from the jet pipe. The hub of the assembly is mounted on the central exhaust-cone within the jet pipe, with the probes extending into the exhaust-gas stream at spaced positions around the cone. The thermocouple wires are electrically interconnected in parallel with one another in the hub so that their common output provides an average measure of the exhaust-gas temperature.

In known forms of thermocouple-probe assemblies external electrical connection to the probes is made by the use of a junction box within the hub of the assembly. This arrangement, however, suffers from the disadvantage that the weight of the junction box adds significantly to the overall weight of the assembly. Alternatively, external electrical connections to the probes in such an assembly have been made by joining conductors of an external cable directly to the thermocouple wires, by, for example, welding. Although this arrangement can be relatively light in weight, it has the disadvantage that the connections are more liable to damage caused by vibration during operation of the engine and it is more difficult to remove the probes for maintanance or replacement.

BRIEF SUMMARY OF THE INVENTION

It is an object of the present invention to provide a sensor-assembly that may be used to alleviate the above-mentioned disadvantages.

According to the present invention, there is provided a sensor-assembly for use in an engine, in which a plurality of sensors are mounted about a central hub, wherein said sensors are electrically interconnected via a plurality of concentric electrically-conductive rings located within said hub.

The provision of the rings enables a light yet robust assembly to be formed.

The sensors may be thermocouples or other temperature-sensing devices, (such as, for example, thermistors) but may alternatively be devices for sensing gas pressure. In this respect, the sensors need not be all of the same form; one or more may be, for example, for temperature sensing whereas the others may be for sensing some other parameter of engine operation.

The electrically-conductive rings may each be of metal, and small elementary portions of the edge of the ring spaced from one another around its circumference may then be turned back to provide electrical connection points for the individual sensors.

A thermocouple-probe assembly in accordance with the present invention, for sensing exhaust-gas temperature within the jet pipe of an aircraft gas-turbine engine, will now be described, by way of example, with reference to the accompanying drawings.

DETAILED DESCRIPTION

Figure 1:
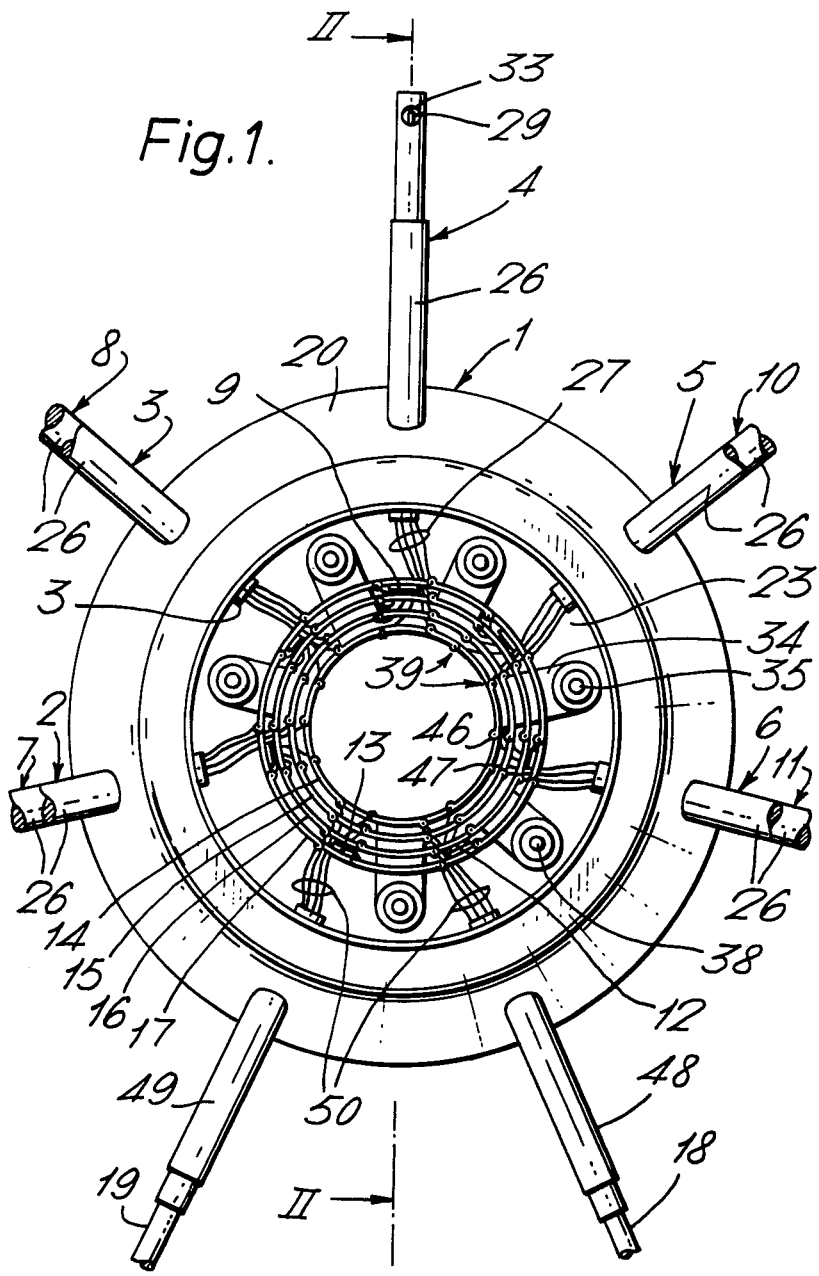
FIG. 1 shows the rear of the thermocouple-probe assembly in elevation.
Figure 2:
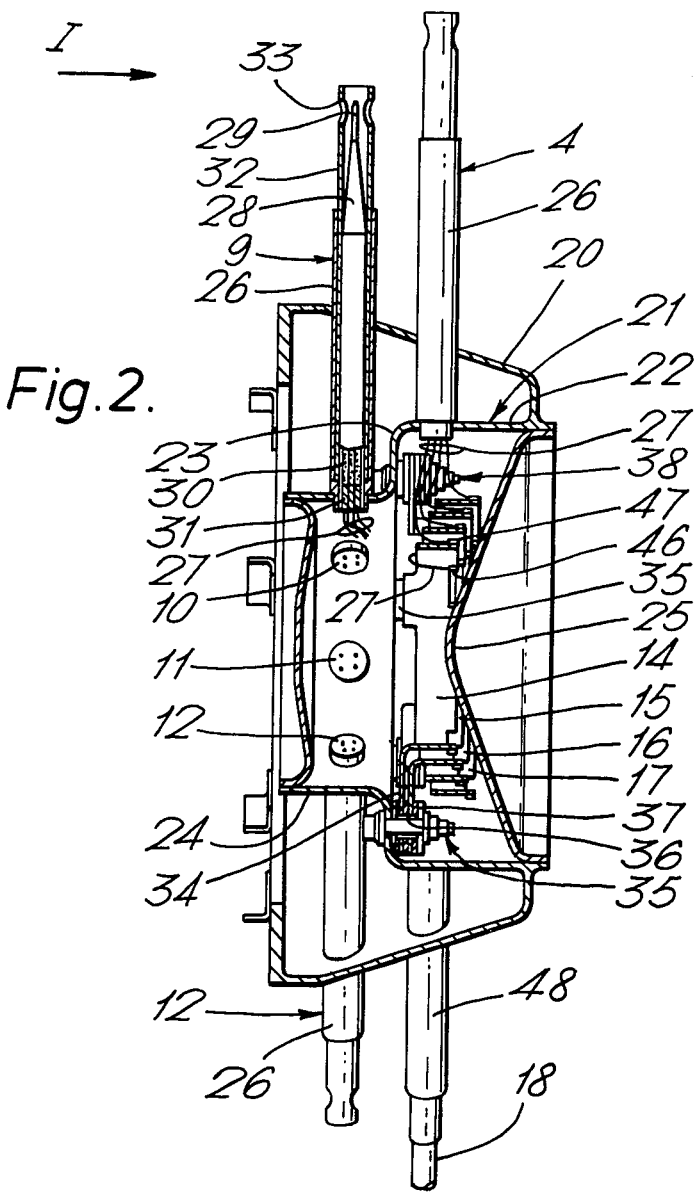
FIG. 2 is a part-sectional view of the thermocouple-probe assembly on the line II—II of FIG. 1.

With reference to FIGS. 1 and 2, the thermocouple-probe assembly includes a central hub 1 that carries two sets of identical thermocouple-probes that extend radially outwards from the hub 1 at spaced positions around its circumference. Gas flows rearwardly through the engine in the direction of the arrow I, that is, from left to right in FIG. 2. The two sets of probes are arranged such that there is an unimpeded flow of gas over each probe. One set consists of five probes 2 to 6 whereas the other set, located in front of the first set, consists of five probes 7 to 11 in register with the probes 2 to 6, and two further probes 12 and 13. Electrical connection is made from each of the probes 2 to 13, to each of four concentric rings 14 to 17 positioned centrally within the hub 1. External electrical connection to the assembly is made to the rings 14 to 17 by two mineral-insulated cables 18 and 19 that are located behind of the two probes 12 and 13.

The hub 1 has a generally frusto-conical outer steel shell 20 that is adapted, as its wider, forward end for mounting on the central exhaust-cone of the aircraft gas-turbine engine. The hub 1 has an inner shell 21, also of steel, which is of a generally cylindrical shape, having a rear portion 22, separated by a ring-shaped ledge 23 from a forward portion 24 of a smaller diameter. The hub 1 is closed at its rear by a removable conical steel back-plate 25.

The seven thermocouple probes 7 to 13 each have an outer support tube 26 that is brazed at one end to the forward portion 24 of the inner shell 21, the probes being spaced apart at equal intervals around the shell 21. The probes 7 to 13 project through the outer shell 20, where the support tubes are also brazed, with the operative tips of the probes located outside the hub 1. The five rear thermocouple probes 2 to 6 each have a support tube 26 that is secured to the rear portion 22 of the inner shell 21, and extends radially outwards through the outer shell 20. The five probes 2 to 6 are positioned directly behind the probes 7 to 11 with respect to the gas flow and, because they are secured to the larger diameter portion 22 of the shell 21, have their operative tips located a short distance further out from the centre of the hub 1 than the forward probes 7 to 13.

Each of the thermocouple probes 2 to 13 has two Chromel-Alumel junctions located at its outer operative tip. In each probe four thermocouple wires 27 extend along the length of the probe within a metal sheath 28 that tapers to a small diameter 29 at the operative tip, about the two junctions, so as to reduce thermal insulation of the junctions from the surroundings. The thermocouple wires 27 are insulated from the sheath by a compacted mineral filling 30 such as, for example, magnesium oxide, and extend out from the rear end of the probe through a ceramic seal 31. The metal sheath 28 is secured coaxially within a metal sleeve 32 that has an open end and two vent holes 33 at the operative tip. The metal sleeve 32 extends within and projects from one end of the support tube 26 so as to protect the sheath 28 from accidental damage.

The four concentric rings 14 to 17 are in the form of metal strips, the metal used for each individual ring being the same as that of the thermocouple wires connected to it so as to avoid establishment of any additional thermocouple junctions where the connections are made. The rings 14 and 16 are therefore of Alumel, and the rings 15 and 17 of Chromel. Each of the rings 14 to 17 has three supporting tabs 34 which are spaced apart around its circumference and which extend radially outwards from the front of the ring. The two inner rings 14 and 15 are supported by their tabs 34 on three sets of nuts and bolts 35 mounted on the ledge 23, the tabs being electrically insulated from one another by an insulating sleeve 36 and three insulating washers 37 carried by each bolt. Similarly the two outer rings 16 and 17 are supported by their tabs 34 within the hub 1 by two sets of nuts and bolts 38 mounted on the ledge 23. The rings 14 to 17 are stepped rearwards from the inside with respect to one another by virtue of the fact that the tabs 34 of the inner ring 14 are mounted in front of the tabs 34 of the adjacent ring 15, and the tabs 34 of the ring 16 are mounted in front of the tabs 34 of the outer ring 17 and slightly behind the tabs 34 of the adjacent ring 15.

Figure 3:
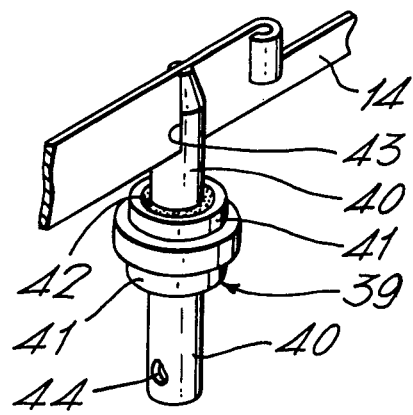
FIG. 3 is an enlarged perspective view of a part of one of four coaxial rings used within the assembly for establishing electrical interconnection of the thermocouple probes.

The rings 14 to 17 may alternatively be mounted in the manner shown in FIG. 3. In this arrangement the rings 14 to 17 (only one of which, ring 14, is shown) are each supported by mounting members 39 which project from the ledge 23 and which are formed from short lengths of mineral-insulated cable. Each member 39 has a large diameter conducting core 40 that projects from either end of a metal sheath 41, the core being insulated from the sheath by an insulating mineral filling 42. The core 40 of each member 39 is of the same metal as that forming the respective ring, the core, at one end, being tapered and provided with a slot 43 for receiving the ring. Each member 39 is mounted in the assembly with the other end of the core 40 projecting through the ledge 23 and the sheath 41 brazed or welded to it. The end of the core 40 is formed with a transverse hole 44 in which a wire may be welded so as to provide external electrical connection. Alternatively, the core may be provided with any other suitable means for making external electrical connection. If this mounting arrangement were adopted, the rings 14 to 17 would be of a larger diameter and would not be formed with the tabs 34 described in the first arrangement.

Details of the way in which electrical connections from the probes are established to the rings 14 to 17 will now be described with particular reference to FIG. 4.

Figure 4:
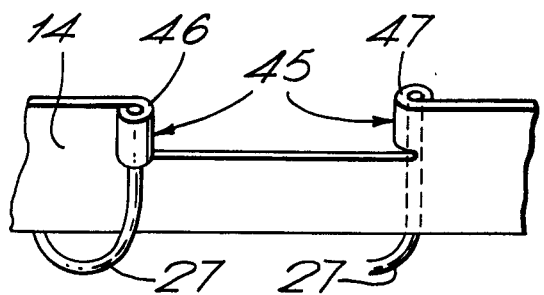
FIG. 4 is an enlarged view of a part of one of the four rings showing an alternative mounting arrangement for the ring.

Referring to FIG. 4, each ring has seven pairs of loops 45 around its surface which lie close to its rear edge and in which the thermocouple wires 27 are retained. The loops are formed by cutting the rings and rolling back cut portions of the ring on either side to form a loop 46 on the inner surface, and another loop 47 on the outer surface of the ring, both lying parallel with the axis of the ring.

Thermocouple wires 27 from the forward probes 7 to 13 extend from below the rings 14 to 17 to make connection with the loops 46 lying on the inner surfaces of the rings, whereas the thermocouple wires 27 from the rear probes 2 to 6 make connection with the loops 47 lying on the outer surfaces of the rings. The thermocouple wires 27 are secured in the loops by welding, although they could be secured by crimping the loops tightly about the wires and further secured by welding.

The two mineral-insulated cables 18 and 19, that serve to establish external electrical connection with the probes 2 to 13, extend through metal sleeves 48 and 49 which are brazed to the outer shell 20 and the rear portion 22 of the inner shell 21 and which are positioned behind the probes 12 and 13 respectively. Each of the cables 18 and 19 has two Alumel and two Chromel wires 50 extending along its length that are insulated from one another by a compacted mineral insulant. Each of the two Alumel wires is connected to a different one of the Alumel rings 14 and 16, and each of the two Chromel wires is connected to a different one of the Chromel rings 15 and 17. The wires 50 may be secured to the outer loops 47 of the rings, in the same way that the thermocouple wires 27 are connected to the rings or, if the mounting arrangement shown in FIG. 3 is used, connection may be made via the cores 40 of the mounting members 39. Electrical connection is thereby established between the two cables 18 and 19, and the thermocouple junctions within the probes 2 to 13 via the four metal rings 14 to 17. Although only one cable is required to make electrical connection with the probes via the rings, an additional cable is provided for use if the other cable becomes damaged.

The thermocouple-probe assembly described above allows for easy repair and maintenance, since faulty probes can be easily disconnected and replaced without interfering with the operation of the remaining probes. The interconnections between the probes 2 to 13 and the cables 18 and 19 are light in weight and yet are substantially rigid, the lengths of the thermocouple wires 27 and the cable wires 50 being fairly short, thereby avoiding excessive movement when the assembly is subjected to vibration.

The central recess within the inner shell 21 of the hub 1 may be filled with magnesium oxide powder to support the thermocouple and cable wires 27 and 50 respectively, thereby further reducing any movement of these wires upon vibration that might otherwise cause damage to the connection with the rings 14 to 17.

The thermocouple probes need have only one junction, and in this case only two concentric rings need be provided in the hub. Similarly each probe could have more than two junctions, in which case, more than four rings could be provided. The number and length of the probes, the materials of the thermocouple junctions, and the number of output cables could be similarly altered to suit any particular application.

I claim:

1. A sensor-assembly for use in an engine, comprising a hub, a plurality of sensors, electrical conductors connected with said sensors, means mounting the said sensors about the said hub, a plurality of electrically-conductive rings, means mounting said rings concentrically with one another within said hub, and means for securing said conductors to said rings to electrically connect said sensors with one another.

2. A sensor-assembly according to claim 1 wherein the said rings are mounted coaxially of the said hub.

3. A sensor-assembly according to claim 1 wherein the said sensors each include an elongate portion and wherein each said elongate portion is mounted on the said hub to extend radially therefrom.

4. A sensor-assembly according to claim 1 wherein external electrical connection to the said sensors is made via the said rings.

5. A sensor-assembly according to claim 1 wherein each said sensor is a thermocouple.

6. A sensor-assembly according to claim 5 wherein each said thermocouple includes a junction between a first wire of one material and a second wire of another material, wherein the said rings include a first ring of said one material and a second ring of said other material, and wherein each of said first wire is connected to said first ring and each said second wire is connected to said second ring.

7. A sensor-assembly according to claim 1 wherein each said ring has an edge and wherein small elementary portions of said edge of each said ring spaced from one another around its circumference are turned back thereby to provide electrical connection points for the said sensors.

8. A sensor-assembly according to claim 1 wherein said hub is filled with an electrically-insulative material.

9. A sensor-assembly for use in an engine, comprising a hub, a plurality of thermocouple sensors, each said thermocouple sensor including a junction between a first wire of one material and a second wire of another material, means mounting the said thermocouple sensors about the said hub, a first ring of said one material, a second ring of said other material, means mounting said first and second rings concentrically of one another and coaxially within said hub, means scuring said first wire of each said thermocouple sensor to said first ring so as to electrically connect said first wire with said first ring, means securing said second wire of each said thermocouple sensor to said second ring so as to electrically connect said second wire with said second ring, external electrical conductor means and means connecting said external electrical conductor means so as to make said external electrical connection to said thermocouple sensors via said first and second rings.

* * * * *